United States Patent
Kaikkonen et al.

(10) Patent No.: US 10,433,447 B2
(45) Date of Patent: Oct. 1, 2019

(54) INTERCONNECT STRUCTURE FOR COUPLING AN ELECTRONIC UNIT AND AN OPTICAL UNIT, AND OPTOELECTRONIC MODULE

(71) Applicant: FINISAR CORPORATION, Sunnyvale, CA (US)

(72) Inventors: Andrei Kaikkonen, Jaerfaella (SE); Lennart Per Olof Lundqvist, Jaerfaella (SE); Lars-Goete Svensson, Vallentuna (SE); Peter Lindberg, Uppsala (SE)

(73) Assignee: Finisar Corporation, Sunnyvale, CA (US)

( * ) Notice: Subject to any disclaimer, the term of this patent is extended or adjusted under 35 U.S.C. 154(b) by 131 days.

(21) Appl. No.: 15/805,070

(22) Filed: Nov. 6, 2017

(65) Prior Publication Data

US 2018/0124942 A1    May 3, 2018

Related U.S. Application Data (63) Continuation of application No. 14/736,462, filed on Jun. 11, 2015, now Pat. No. 9,814,153, which is a
(Continued)

(30) Foreign Application Priority Data

Dec. 11, 2012   (EP) ..................................... 12196474

(51) Int. Cl.
| | |
|---|---|
| *H05K 7/02* | (2006.01) |
| *H01S 5/022* | (2006.01) |
| *H01S 5/042* | (2006.01) |
| *H05K 1/02* | (2006.01) |
| *G01J 1/02* | (2006.01) |
| *G01J 1/44* | (2006.01) |

(Continued)

(52) U.S. Cl.
CPC .............. *H05K 7/026* (2013.01); *G01J 1/029* (2013.01); *G01J 1/44* (2013.01); *H01S 5/02276* (2013.01); *H01S 5/0427* (2013.01); *H04B 10/801* (2013.01); *H05K 1/025* (2013.01); *H05K 1/0216* (2013.01); *G01J 2001/446* (2013.01); *G02B 6/4279* (2013.01); *H01S 5/06226* (2013.01); *H01S 5/423* (2013.01); *H05K 1/0243* (2013.01); *H05K 2201/10121* (2013.01)

(58) Field of Classification Search
CPC .......... H05K 2201/10121; H05K 7/026; H01S 5/0427
See application file for complete search history.

(56) References Cited

U.S. PATENT DOCUMENTS 9,425,901 B2 * 8/2016 Groepl ................. H04B 10/697
2003/0052380 A1 3/2003 Yeo et al.

* cited by examiner

Primary Examiner — Tony Ko
(74) Attorney, Agent, or Firm — Maschoff Brennan (57) ABSTRACT

An optoelectronic module is provide and includes an electronic unit, an optical unit, and an interconnect structure. The electronic unit is capable of outputting and/or receiving electric signals, while the optical unit is capable of converting the electric signals into optical signals. The interconnect structure connects the electronic unit and the optical unit, and includes an electrically conducting substrate and a pair of transmission leads connecting electronic unit and the optical unit. The pair of transmission leads includes a signal lead and a ground lead having lower impedance than the signal lead.

20 Claims, 6 Drawing Sheets

Related U.S. Application Data continuation of application No. PCT/EP2013/075005, filed on Nov. 28, 2013.

(51) Int. Cl.
*H04B 10/80* (2013.01)
*H01S 5/062* (2006.01)
*H01S 5/42* (2006.01)
*G02B 6/42* (2006.01)

INTERCONNECT STRUCTURE FOR COUPLING AN ELECTRONIC UNIT AND AN OPTICAL UNIT, AND OPTOELECTRONIC MODULE

CROSS-REFERENCE TO RELATED APPLICATIONS

This application is a continuation U.S. patent application Ser. No. 14/736,462 filed Jun. 11, 2015 which is a continuation of PCT International Application No. PCT/EP2013/075005 filed Nov. 28, 2013, which claims priority under 35 U.S.C. § 119 to European Patent 2196474.6 filed Dec. 11, 2012.

FIELD OF THE INVENTION

The invention relates to an interconnect structure and, more particularly, to an interconnect structure for coupling an electronic unit for outputting and/or receiving electric signals, and an optical unit for converting said electric signals into optical signals and/or vice versa.

BACKGROUND

In order to support the communication requirements of high-speed data transmission applications (for instance at bit rates of 25 Gbps) optical links are used as an alternative to merely electrical wire based interconnection. Currently, manufacturers produce products such as modules for optical interconnects and so-called optical cables. In this context, an optical module may be a transmitter (i.e. comprising a light source for transmitting an optical data signal), a receiver (i.e. comprising a photo detector for receiving an optical signal) or a transceiver, which is a combined receiver and transmitter.

Often, modules come with a connector for connecting one or more optical fibers for transporting the optical data signal. In an optical cable the module and fiber is typically preconnected. It is also possible to have the module or the components of the module mounted directly on a circuit board, such as a motherboard for a computer, for example for interconnects in a supercomputer or as a connection to peripheral equipment.

In the context of the invention an optoelectronic module refers in general to a system comprising optoelectronic components for transmitting or receiving an optical signal connected to driver and/or receiver electronics. Optoelectronic components are in the present context devices arranged to convert electrical energy into optical energy or optical energy into electrical energy, i.e. light sources and photo detectors, such as laser diodes and photo diodes. Often the laser diodes are so-called vertical cavity surface emitting lasers (VCSEL) and as photo diodes p-intrinsic-n photo diodes may be used.

Typically, such a known module will also include an interface allowing the module to be connected to one or more optical fibers as well as control electronics to adjust the operating parameters of optoelectronic components. For example, the operation of a laser diode typically requires an adjustable bias current, modulation current and optionally pre-emphasis. Often, such modules will support more than one channel, such as 2, 4, 8, 12 or 16 channels, but any number of channels is conceivable depending on the application. For such a use the light sources and photo detectors are often available in arrays, such as 1×N arrays or 2×N arrays, wherein N is a positive integer. Strictly, a 2×N array is referred to as a matrix, but in order to simplify notation only the term "array" is used in the following.

In order to convert an electrical data signal into a signal suitable for driving a light source to emit an optical signal comprising this data signal, a driver circuit is required. Similarly, a receiver circuit is required to convert received optical signals into an electrical signal suitable for further transmission in the system. Such driver and receiver circuits are well known in the art and they are typically provided as integrated circuits either as driver chips (comprising driver circuits), transmitter chips (comprising driver circuits), or transceiver chips (comprising a driver and receiver circuit).

A receiver chip may often also be referred as a TIA chip (transimpedance amplifier chip) or a LIA chip (limiting impedance amplifier chip). The chips comprise data pins/pads for receiving/transmitting the electrical data signal to/from a host system and connecting pads for connecting to the optical devices, i.e. connecting pins/pads for connecting to the optical side of the chip (i.e. light sources or photo detectors).

In all data transmission systems, signal integrity is a key issue. Due to the high data rates in recently developed communication systems having data transmission rates of e.g. 25 Gbps, signal integrity, such as for instance the reduction of cross-talk between signal lines, has become a major concern.

Ideally, an interconnection system will carry signals without distortion. One type of distortion is called cross-talk. Cross-talk occurs when one signal creates an unwanted signal on another signal line. Generally, cross-talk is caused by electromagnetic coupling between signal lines. Therefore, cross-talk is a particular problem for high-speed, high-density interconnection systems. Electromagnetic coupling increases when signal lines are closer together or when the signals they carry are of a higher frequency. Both of these conditions are present in a high-speed, high-density interconnection system.

Figure 1:
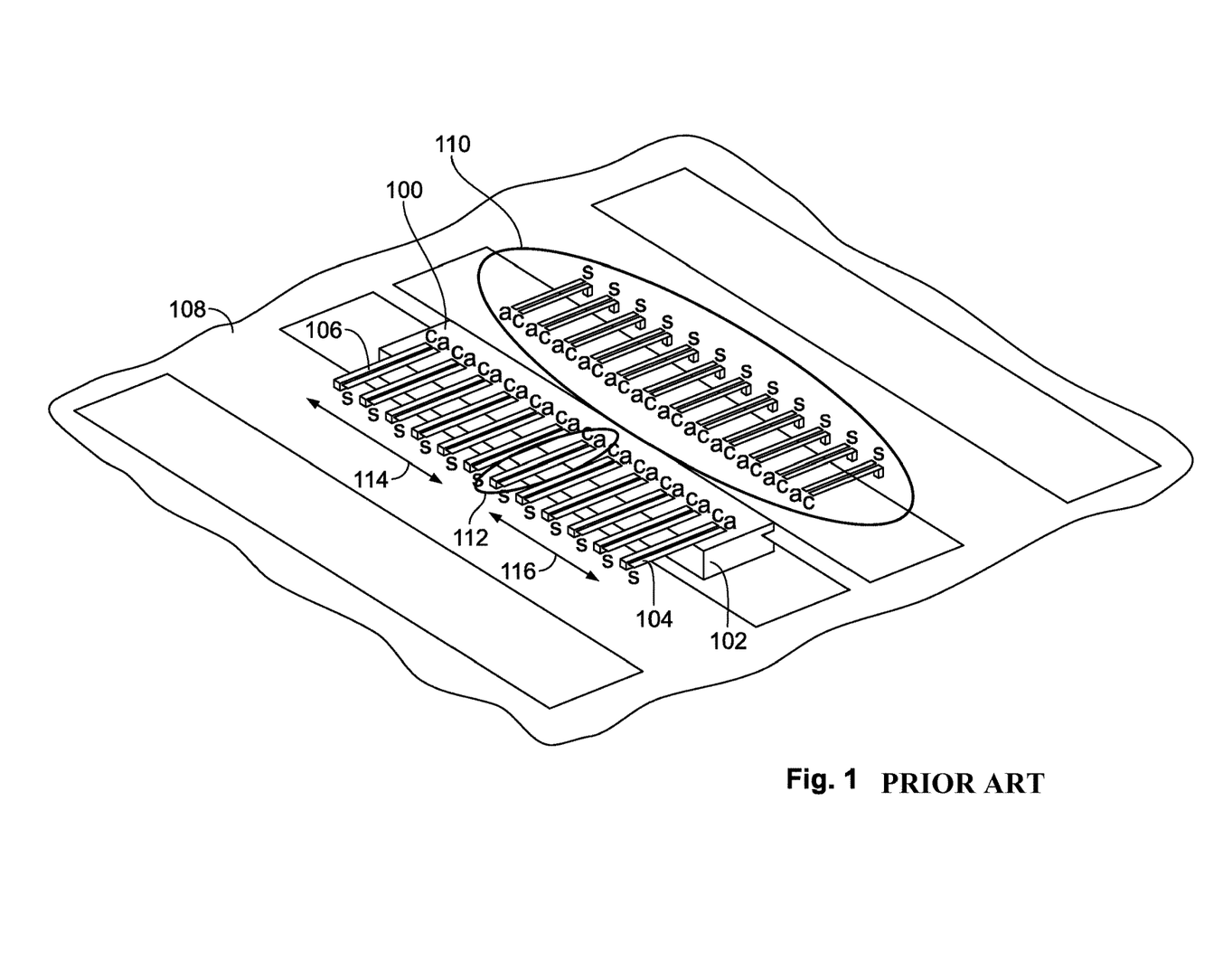
FIG. 1 is perspective view of a known optoelectronic module with interconnects having essentially equal impedance.

In particular for high-frequency applications, the interconnect structure that is provided to connecting the optical components and the electronic components to each other will have significant impact on the signal integrity. FIG. 1 shows an example of known optoelectronic module with an interconnection between a driver circuitry and a VCSEL array 100 as it might be used for a so-called E/O engine (electro-optic engine) which is suitable for converting electric signals into optical ones. The example of FIG. 1 shows a 12-channel topology with a 12 channel VCSEL array 100 being mounted in an electrically conductive substrate 102. Each of the array's diodes has a cathode and an anode (marked as c and a terminals in FIG. 1) which are connected by means of edge coupled transmission lines or bond wires 104 to a driver circuitry.

In particular, these interconnecting lines are formed in pairs and each pair comprises a signal line 104 (denoted with s) and a ground line 106. As shown in FIG. 1, each of the ground lines 106 are connected to a ground plane layer 108. An example for a technical implementation of this schematic arrangement is given in the Reference Design IPVD12G011-ULM850-10-TTN0104U rev. 04 released Jun. 17, 2009, by Philips Technologie GmbH U_L_M Photonics and IPtronics A/S (to be downloaded from the internet URL http://iptronics.com/files/14774/IPBVD12G011_ULM_RefDesign.04.pdf).

The known module shown in FIG. 1 moreover has an array of further interconnects 110 for connecting a PIN diode array to a belonging amplifier (TIA) also located on the circuit carrier of FIG. 1.

Figure 2:
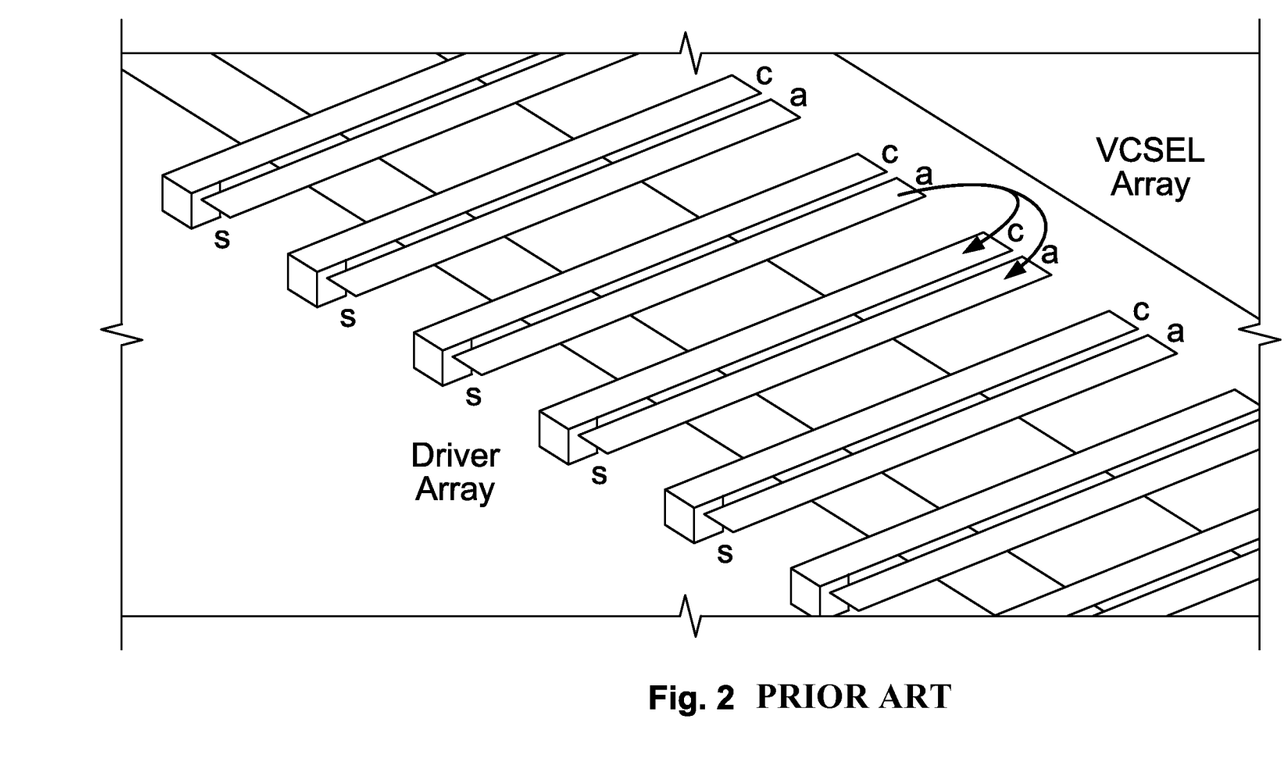
FIG. 2 is a close up perspective view of the known optoelectronic module of FIG. 1 showing cross talk effects.

When considering the channel number 7 (marked with reference numeral 112) as a target, and the remaining channels 114, 116 as the transmitter signal aggressors, it can be found that the cross talk, which is generated by this configuration, amounts to 4 ps or 0.1 UI jitter in an EYE diagram at a 25 Gbps bit rate and a bit error rate (BER) of 10-12. Since the VCSEL are placed on a highly conductive substrate, the high coupling and cross talk between neighboring driver VCSEL channels can be attributed to the fact that the impedance of the return current trace is similar to the impedance of a signal trace for the neighboring channel. Thus, significant amount of the aggressor return current is forced to pass through the VCSEL of the target channel, thereby generating a high level of cross talk. This effect is shown schematically in FIG. 2.

Consequently, a problem exists that is to provide an interconnect structure and a belonging optoelectronic module, whereby the signal integrity can be improved in a particularly simple and cost-efficient way.

SUMMARY

An optoelectronic module is provide and includes an electronic unit, an optical unit, and an interconnect structure. The electronic unit is capable of outputting and/or receiving electric signals, while the optical unit is capable of converting the electric signals into optical signals. The interconnect structure connects the electronic unit and the optical unit, and includes an electrically conducting substrate and a pair of transmission leads connecting electronic unit and the optical unit. The pair of transmission leads includes a signal lead and a ground lead having lower impedance than the signal lead.

BRIEF DESCRIPTION OF THE EMBODIMENT(S)

The accompanying drawings are incorporated into and form a part of the specification to illustrate several embodiments of the invention. These drawings together with the description serve to explain the principles of the invention. The drawings are merely for the purpose of illustrating the preferred and alternative examples of how the invention can be made and used, and are not to be construed as limiting the invention to only the illustrated and described embodiments. Furthermore, several aspects of the embodiments may form—individually or in different combinations—solutions according to the invention. Further features and advantages will become apparent from the following more particular description of the various embodiments of the invention, as illustrated in the accompanying drawings, in which like references refer to like elements, and wherein.

DETAILED DESCRIPTION OF THE EMBODIMENT(S)

Figure 3:
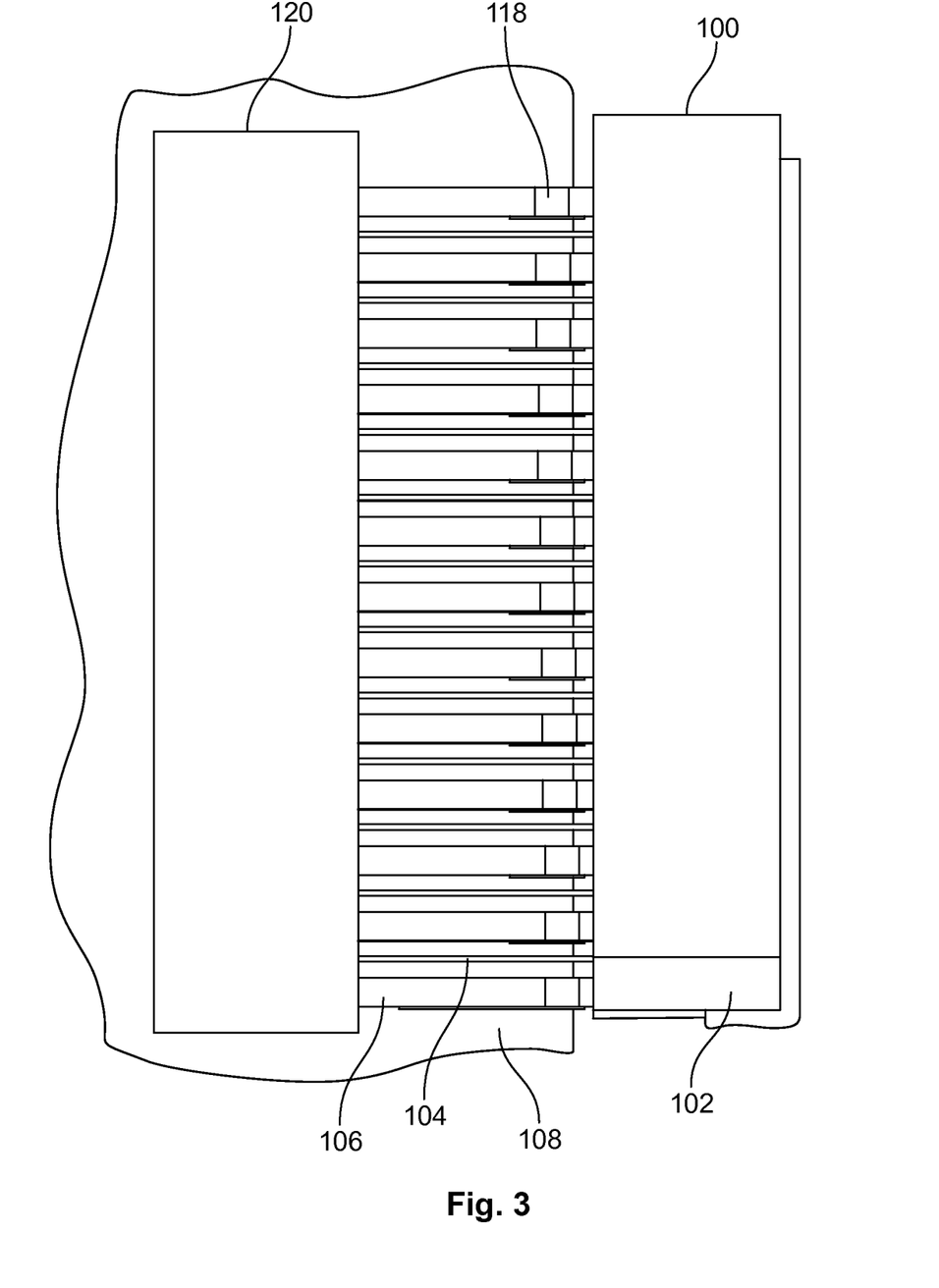
FIG. 3 is a perspective view of an optoelectronic module having an interconnect structure according to the invention.

Referring now to FIG. 3, an optoelectronic module having an interconnect structure according to the invention will be described.

Figure 4:
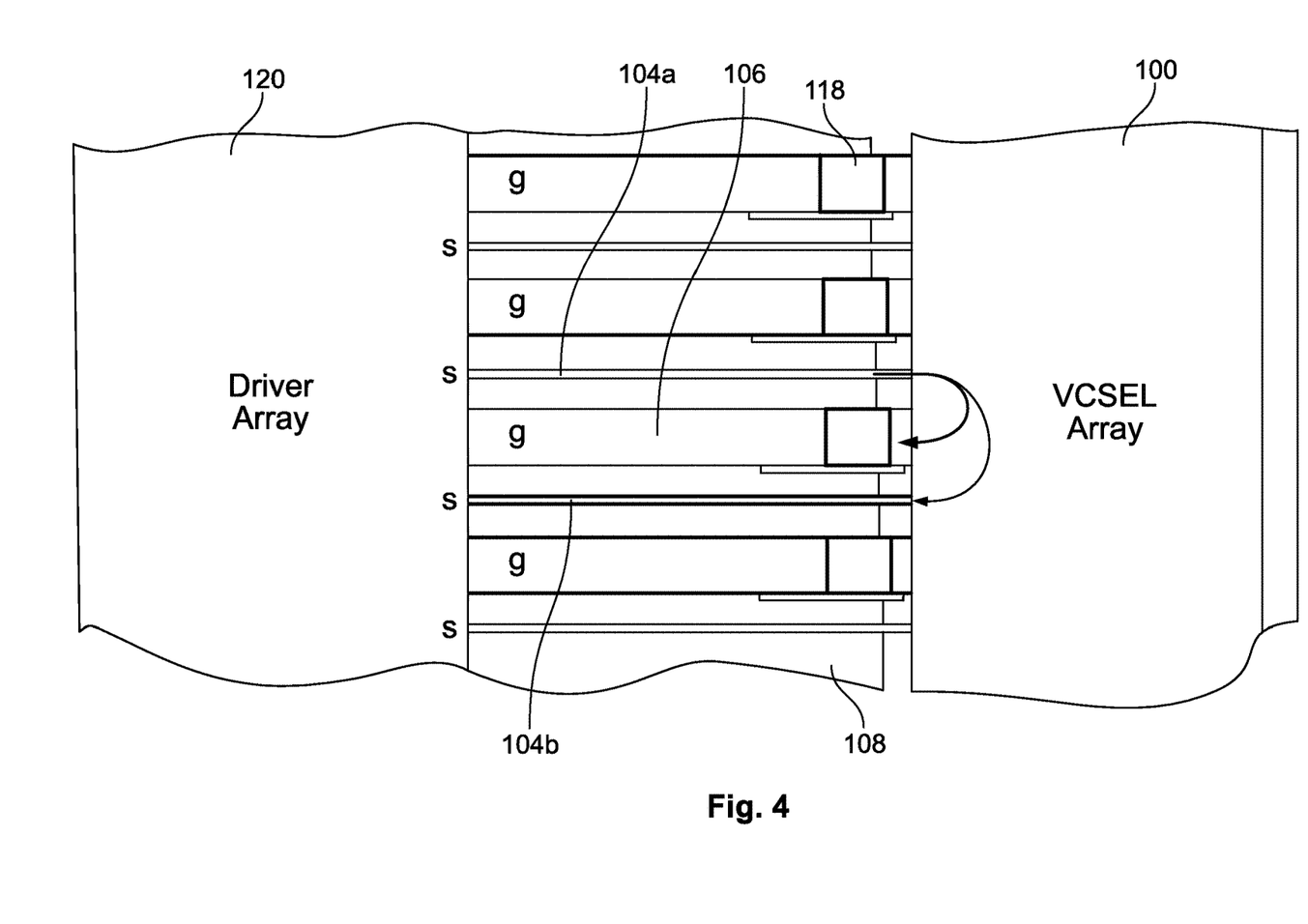
FIG. 4 is a close up top plan view of the optoelectronic module with the interconnect structure of FIG. 3.

In FIGS. 3 and 4, the electrically insulating parts of the circuit carrier are not shown in order to more clearly illustrate the electric connections between the conductive parts.

However, of course also insulating layers are present and furthermore, the shown metallic layers do not have to be the only electrically conductive layers.

As shown in the perspective view of FIG. 3, a VCSEL array 100 having an electrically conductive substrate 102 is connected to a ground plane layer 108. On an active chip surface of the VCSEL array 100, contact pads (not visible in this figure) are provided for contacting the anode and cathode of the individual laser diodes. In particular, each signal line 104 is connected to an anode of a VCSEL. On the other hand, each ground line 106 is connected to a cathode terminal of a VCSEL.

According to the invention, the ground lines 106 have a significantly lower impedance than the signal lines 104. In the embodiment shown in FIG. 3, this is firstly achieved by choosing the dimensions of the leads in a way that the signal lines 104 are significantly narrower than the ground lines 106. Furthermore, each of the ground lines 106 is connected to the underlying ground plane layer by means of a via contact 118.

A driver array 120 to which the ground lines 106 and the signal lines 104 are connected may symbolize either a directly soldered or press fitted integrated circuit (IC), or a connector for attaching respective wires.

By means of the arrangement according to the invention, the signal line impedance is not influenced by the distance between the signal line 104 and the ground line 106, but only by the distance to the underlying ground plane layer. This distance may for instance be as small as 10 gm, whereas the distance between the signal line 104 and the ground line 106 may be 60 gm.

Preferably, the ground lines 106 are at least five times wider than the signal lines 104. For instance, the signal lines may have a width of about 20 gm, whereas the ground lines have a width of 110 gm. The impedance value of the signal lines 104 is set by the width of the signal lines and their distance to the ground plane layer to a value of about 50 Ohm. Of course, these particular dimensions are only examples of the values that can be used to implement the idea according to the invention.

By using this particular construction, the impedance for the signal return path is significantly reduced and thus a much lower amount of the aggressor return current passes through the VCSEL of the target channel. This is illustrated in FIG. 4, which is a detail of FIG. 3. As can be seen from this figure, the main part of the return signal is guided by the ground line 106 and only a smaller fraction of the energy returns via the adjacent signal path 104b.

Figure 5:
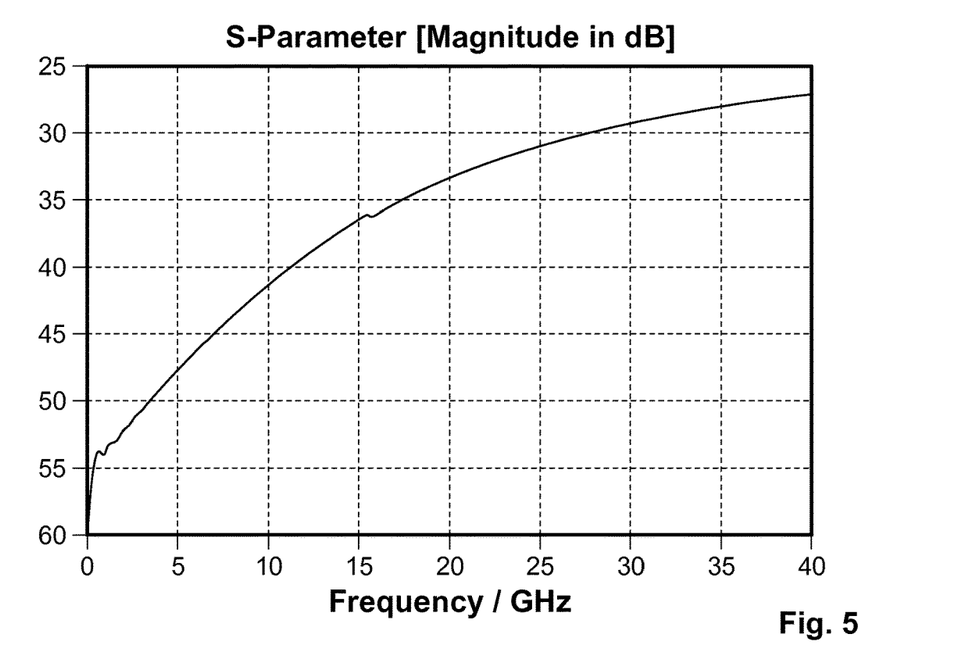
FIG. 5 is a schematic diagram showing s-parameter coupling coefficient vs. frequency curve corresponding to the strongest cross talk from driver output to the neighbouring channel VCSEL input obtained from the known optoelectronic module of FIG. 1.
Figure 6:
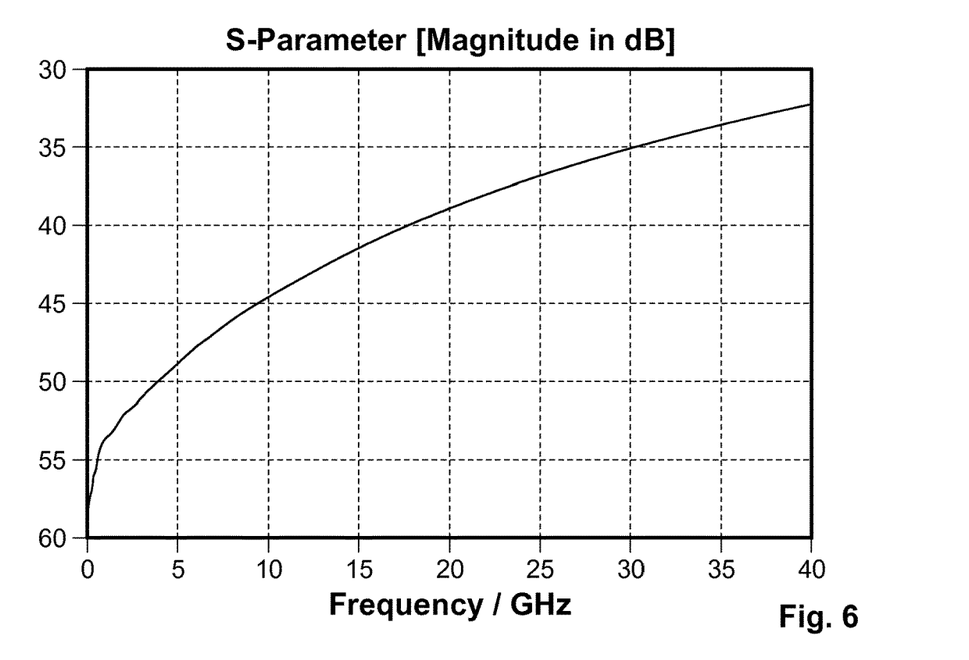
FIG. 6 is a schematic diagram showing s-parameter coupling coefficient vs. frequency curve corresponding to the strongest cross talk from driver output to the neighbouring channel VCSEL input obtained from the optoelectronic module with the interconnect structure of FIG. 3.

This effect is also mirrored by comparing the s-parameter vs. frequency curves shown in FIGS. 5 and 6 for the arrangement of FIGS. 1 and 3, respectively. Each of these s-parameter coupling coefficients are shown corresponding to the strongest cross talk from the driver output to the neighboring channel VCSEL input.

Figure 7:
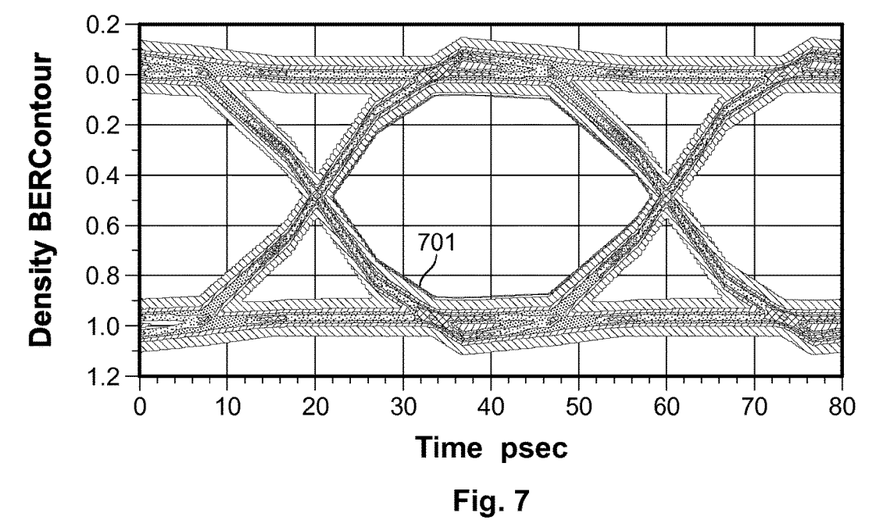
FIG. 7 is a 25 Gbps EYE diagram for a Driver-VCSEL channel with all aggressor channels activated, for the known optoelectronic module of FIG. 1.
Figure 8:
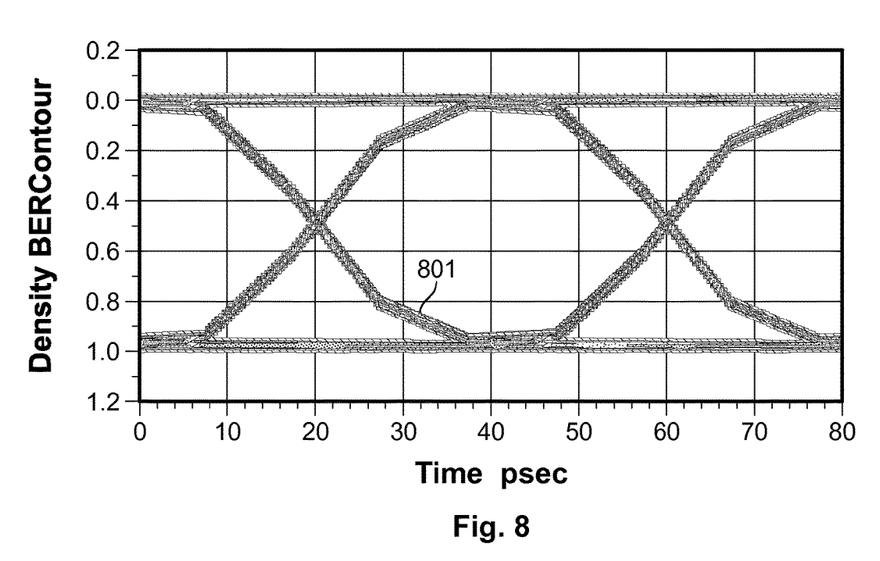
FIG. 8 is a 25 Gbps EYE diagram for a Driver-VCSEL channel with all aggressor channels activated, for the optoelectronic module with the interconnect structure of FIG. 3.

FIGS. 7 and 8 show in a comparison the respective EYE diagrams for a 25 Gbps bit rate and a bit error rate of BER=10-12. As shown in FIG. 7, the arrangement of FIG. 1 generates about 4 ps or 0.1 UI jitter for a driver VCSEL channel with all aggressor channels activated, whereas according to FIG. 8 the cross talk generates below 1.8 ps or 0.05 UI jitter in the EYE diagram. The outlines 701 and 801, respectively, correspond to BER=10-12.

Consequently, both the coupling between neighboring channels and the jitter due to the cross talk are significantly reduced when comparing the interconnect solution according to the invention to the case with equal impedances according to FIG. 1. Thus, the interconnect structure according to the invention reduces crosstalk level between the channels, allowing longer transmission links and yielding a better quality of the signal.

The invention is based on the idea that by modifying the impedance of the return path for the driver-VC SEL interconnect in a way that it is significantly lower than that of the signal path, a significantly lower amount of the aggressor return current passes through the VCSEL of any target channel.

According to the invention, an optoelectronic module based on the electrical interconnect structure has an optical unit, such as a VCSEL array, with an electrically conducting substrate that can be connected to a ground plane layer of the interconnect structure. This topology leads to a particularly efficient cross talk suppression by choosing the impedance ratio of the signal and ground line according to the invention.

The foregoing illustrates some of the possibilities for practicing the invention. Many other embodiments are possible within the scope and spirit of the invention. Therefore, more or less of the aforementioned components can be used to conform to that particular purpose. It is, therefore, intended that the foregoing description be regarded as illustrative rather than limiting, and that the scope of the invention is given by the appended claims together with their full range of equivalents.

What is claimed is:

1. An optoelectronic module, comprising:
   a driver circuit configured to output and/or receive an electrical signal;
   a laser configured to convert the electrical signal into an optical signal;
   an interconnect structure connecting the driver circuit and the laser, the interconnect structure comprising an electrically conductive substrate and a pair of transmission leads connecting the driver circuit and the laser and having a signal lead and a ground lead having lower impedance than the signal lead; and
   a ground plane layer underlying the ground lead, wherein the ground lead is electrically coupled to the ground plane layer;
   wherein an impedance of the signal lead is defined by its width and a distance to the ground plane layer, and the ground lead has a width that is larger than a width of the signal lead.

2. The optoelectronic module of claim 1, wherein the ground lead has a width that is at least five times larger than the width of the signal lead.

3. The optoelectronic module of claim 1, wherein the ground lead is electrically coupled to the ground plane layer by a via.

4. The optoelectronic module of claim 1, wherein the signal lead is connected to an anode of the laser.

5. The optoelectronic module of claim 1, wherein the ground lead is connected to a cathode of the laser.

6. The optoelectronic module of claim 1, further comprising an array of lasers including the laser.

7. The optoelectronic module of claim 6, further comprising a 12-channel laser mounted in the electrically conductive substrate.

8. The optoelectronic module of claim 1, further comprising an optical receiver and an amplifying circuit for amplifying output signals of the optical receiver.

9. The optoelectronic module of claim 8, wherein the optical receiver includes an array of PIN (positive intrinsic negative) photo diodes and the amplifying circuit includes a transimpedance amplifier (TIA) array.

10. The optoelectronic module of claim 1, wherein the laser is a vertical cavity surface emitting laser (VCSEL).

11. The optoelectronic module of claim 1, wherein a majority of a return signal is guided by the ground lead rather than the signal lead.

12. An optoelectronic module, comprising:
    a driver array configured to output and/or receive electrical signals;
    a laser array configured to convert the electrical signals into optical signals;
    an interconnect structure connecting the driver array and the laser array, the interconnect structure comprising an electrically conductive substrate and transmission leads connecting the driver array and the laser array and having signal leads and ground leads having lower impedance than the signal leads; and
    a ground plane layer underlying the ground leads, wherein the ground leads are electrically coupled to the ground plane layer;
    wherein the ground leads have a width that is larger than a width of the signal leads.

13. The optoelectronic module of claim 12, wherein the ground leads have a width that is at least five times larger than the width of the signal leads.

14. The optoelectronic module of claim 12, wherein the ground leads are electrically coupled to the ground plane layer by vias.

15. The optoelectronic module of claim 12, wherein each of the signal leads are connected to an anode of a laser of the laser array.

16. The optoelectronic module of claim 12, wherein each of the ground leads are connected to a cathode of a laser of the laser array.

17. The optoelectronic module of claim 12, the laser array comprising vertical cavity surface emitting laser (VCSEL).

18. The optoelectronic module of claim 12, wherein the signal leads are narrower than the ground leads.

19. The optoelectronic module of claim 12, wherein a majority of return signals are guided by the ground leads rather than adjacent signal leads.

20. An optoelectronic module, comprising:
    a driver array configured to output and/or receive electrical signals;
    a laser array configured to convert the electrical signals into optical signals;

an interconnect structure connecting the driver array and the laser array, the interconnect structure comprising an electrically conductive substrate and transmission leads connecting the driver array and the laser array and having signal leads and ground leads having lower impedance than the signal leads; and a ground plane layer underlying the ground leads, wherein the ground leads are electrically coupled to the ground plane layer;

wherein the ground leads are electrically coupled to the ground plane layer by vias and the signal leads are narrower than the ground leads such that return signals are guided by the ground leads.

* * * * *